(12) United States Patent
Redden

(10) Patent No.: US 7,182,810 B2
(45) Date of Patent: Feb. 27, 2007

(54) PROTEIN TEMPERATURE EVAPORATION-CONTROLLED CRYSTALLIZATION DEVICE AND METHOD THEREOF

(75) Inventor: Robert F. Redden, Victoria (CA)

(73) Assignee: Canadian Space Agency, St. Hubert (CA)

( * ) Notice: Subject to any disclaimer, the term of this patent is extended or adjusted under 35 U.S.C. 154(b) by 362 days.

(21) Appl. No.: 10/825,179

(22) Filed: Apr. 16, 2004

(65) Prior Publication Data
US 2005/0229841 A1 Oct. 20, 2005

(51) Int. Cl.
*C30B 29/58* (2006.01)

(52) U.S. Cl. .............. 117/68; 117/69; 117/70; 117/925; 422/245.1

(58) Field of Classification Search .......... 117/68, 117/69, 70, 925; 422/245.1
See application file for complete search history.

(56) References Cited

U.S. PATENT DOCUMENTS

| 4,755,363 | A | | 7/1988 | Fujita et al. |
|---|---|---|---|---|
| 4,886,646 | A | | 12/1989 | Carter et al. |
| 5,096,676 | A | | 3/1992 | McPherson et al. |
| 5,126,115 | A | * | 6/1992 | Fujita et al. ............. 117/206 |
| 5,130,105 | A | | 7/1992 | Carter et al. |
| 5,362,325 | A | | 11/1994 | Shiraishi et al. |
| 5,640,010 | A | | 6/1997 | Twerenbold |
| 5,643,540 | A | | 7/1997 | Carter et al. |
| 5,827,531 | A | | 10/1998 | Morrison et al. |
| 6,015,104 | A | | 1/2000 | Rich, Jr. |
| 6,099,864 | A | | 8/2000 | Morrison et al. |
| 6,103,271 | A | | 8/2000 | Morrison et al. |
| 6,214,300 | B1 | | 4/2001 | Morrison et al. |
| 6,355,217 | B1 | * | 3/2002 | Kiefersauer et al. ....... 422/102 |
| 6,387,399 | B1 | | 5/2002 | Morrison et al. |
| 6,406,903 | B2 | | 6/2002 | Bray et al. |
| 6,409,832 | B2 | | 6/2002 | Weigl et al. |
| 6,458,332 | B2 | | 10/2002 | Ooshima et al. |
| 2001/0006679 | A1 | | 7/2001 | Morrison et al. |
| 2001/0026812 | A1 | | 10/2001 | Morrison et al. |

FOREIGN PATENT DOCUMENTS

| JP | 05115922 | 11/1994 |
|---|---|---|
| WO | WO 01/75415 A2 | 10/2001 |

OTHER PUBLICATIONS

Crystal Growth Techniques Data Sheet, *Hampton Research*.
Hanging Droplet Method for Protein Crystallization, p. 1, http://people.cornell.edu/pages/cmf5/CrystalFold/HangDrop.html.

(Continued)

*Primary Examiner*—Robert Kunemund
(74) *Attorney, Agent, or Firm*—Kathleen E. Marsman; Borden Ladner Gervais LLP

(57) ABSTRACT

A temperature- and evaporation-controlled device for the crystallization of proteins from a protein-containing solution. The device comprises a compartment, such as a microcapillary tube, for holding the solution from which crystals are formed. The compartment is in communication with a cold generating unit, such as a cold finger, that maintains a temperature lower than the temperature of the compartment thereby causing de-watering of the solution. A vacuum pump can be attached to the device to reduce vapor pressure to further promote de-watering of the solution. The device can be used terrestrially or in a microgravity environment, such as in outer space, for formation of high quality protein crystals.

12 Claims, 6 Drawing Sheets

OTHER PUBLICATIONS

NASA Fact Sheet, "Advanced Protein Crystallization Facility (APCF)", http://www1.msfc.nasa.gov/NEWSROOM/background/facts/apcf.html.

NASA Fact Sheet, Protein Crystal Growth (PCG) Single-locker Thermal Enclosure System (STES) housing the Protein Crystallization Apparatus for Microgravity (PCAM), http://www1.msfc.nasa.gov/NEWSROOM/background/facts/pcgstet.html.

NASA Recommendations, "Future Biotechnology Research on the International Space Station", *Executive Summery, National Academy Press*, 2000 pp. 1-9.

NASA, "What is Protein Crystallizaation", *Alabama Space Grant Education Outreach*, http://www.uah.edu/ASGC/educationoutreach/crystallization.htm.

* cited by examiner

PROTEIN TEMPERATURE EVAPORATION-CONTROLLED CRYSTALLIZATION DEVICE AND METHOD THEREOF

FIELD OF THE INVENTION

The present invention relates generally to protein crystallization. More particularly, the present invention relates to a device and method for the formation of protein crystals in a temperature- and humidity-controlled environment.

BACKGROUND OF THE INVENTION

Crystallization of proteins is an important requirement in determining protein structure. X-ray crystallography or linear accelerator (cyclotron) characterization techniques are currently used in determining protein structure. Protein crystallography is used to ascertain the three-dimensional molecular structure of protein crystals. This is essential for understanding the biological functions attributed to these macromolecules. The physical shape and folding of a protein is of increasing importance to drug companies interested in rational drug design. Drug molecules are designed to fit exactly into a binding site of a macromolecule, thus blocking its function in a given disease pathway. Producing higher quality crystals results in more accurate modelling of the 3-dimensional protein structures and consequently more efficacious drugs. This accuracy is referred to as the resolution of the structure. The larger and more perfect crystals provide the highest resolution.

Perfect crystals are difficult to achieve on Earth. Ambient gravity and turbulence disrupt crystal formation in that terrestrial samples mix as a result of gravity-driven convective flow. Therefore a microgravity environment promotes better crystal formation, in part due to the lack of turbulence and mixing within a liquid or gaseous sample during crystal formation. Spacecraft in low Earth orbits can provide a microgravity environment that is convection- and sedimentation-free for the study and applications of fluid-based systems. With the advent of the Space Shuttle, scientists had regular access to such environments and many experiments were initiated, including those in protein crystallization. After many trials it became clear that for several proteins, crystallization in a microgravity environment resulted in bigger and better quality crystals. The generation of perfect crystals can sometimes be the limiting factor in determining a protein's structure. By eliminating variables such as gravity, crystals are able to form slower and more precise in space.

Given the great expense required for crystallization studies in space, prior art methodologies to form crystals have largely been terrestrial. The leading technique is the "hanging drop" technique in which a protein in a liquid solution is allowed to "hang" from a well within a specially designed tray, and the liquid gradually evaporates, leaving only the protein crystal. However, the quality of crystals can be compromised in the absence of a microgravity environment. Also, the hanging drop method requires transfer of a crystal from a well within a tray into a micropipette. Further, removal of the vapor to enhance crystal growth is not common in the prior art. Gases (such as argon) are heated and blown over the protein sample of interest; the use of these gases is cumbersome and can lead to contamination. Furthermore, the use of gases renders it difficult to control the reproducibility of the method.

U.S. Pat. No. 6,458,332 issued to Ooshima et al., discloses a device for forming protein crystals from solution. The device is a tank with a temperature differential between the top and the bottom of the tank. A protein-containing fluid is placed in the tank, and the temperature differential forces a portion of the fluid into channels submerged within the fluid and leading upward toward the top of the tank. When the fluid channels are rotated about a central vertical axis, the fluid is sprayed against the top wall of the tank, which causes evaporation and crystal formation. This device does not appear to be suited to a microgravity environment, as gravity appears to be required to maintain the fluid at the bottom of the tank.

U.S. Pat. No. 6,387,399 issued to Morrison et al., describes a method by which crystals are formed under microgravity conditions by encapsulating the protein and exposing it to an osmotically pressurized environment to effect de-watering. Other related U.S. patents include: U.S. Pat. Nos. 6,214,300; 6,103,271; 6,099,864; 6,015,104; and 5,827,531.

The sitting drop vapor diffusion technique is another method for the crystallization of macromolecules. Based on the same principles, a drop of a mixture of sample and reagent is placed in vapor equilibration with a liquid reservoir of reagent. Typically, the drop contains a lower reagent concentration than the reservoir. To achieve equilibrium, water vapor leaves the drop and eventually ends up in the reservoir. As water leaves the drop, the sample undergoes an increase in relative supersaturation. Both the sample and reagent increase in concentration as water leaves the drop for the reservoir. Equilibration is reached when the reagent concentration in the drop is approximately the same as that in the reservoir. One disadvantage of this is the adherence of crystals to the sitting drop surface making removal of the crystals difficult for further analysis. A disadvantage of both sitting drop and hanging drop techniques is that the initial vaporization (before nucleation of the seed crystal) is favored by a slow process. Increased or uncontrolled rate of vaporization can diminish the quality of the crystals.

Temperature can be a significant variable in biological macromolecule and small molecule crystallization. Temperature often influences nucleation and crystal growth by manipulating the solubility and supersaturation of the sample. Thus the control of temperature during crystal production is essential for successful and reproducible crystal growth of proteins with temperature dependent solubility. An advantage is that a temperature gradient provides precise, quick, and reversible control of relative supersaturation. Using temperature in addition to standard crystallization variables (such as sample concentration, reagent composition and concentration, and pH), can increase the probability of producing crystals as well as uncover new crystallization conditions for a sample. Protein solution temperature can be used to carefully manipulate crystal nucleation and growth. This control can also be used to etch or partially dissolve then grow back the crystal in an attempt to improve crystal size, morphology, and quality. Temperature control is noninvasive and can manipulate sample solubility and crystallization with altering reagent formulation.

While controlled temperature can be important for consistent results, temperature fluctuation of the protein solution can be useful in obtaining high quality crystals since for a sample with temperature dependent solubility, changes in temperature can equate to changes in a crystallization reagent condition. Temperature gradients can be used to optimize the use of proteins with temperature-dependent solubility. To achieve this, the experiment is equilibrated at one temperature then slowly changed to a second temperature. The above approach may be useful but does not support a reproducible generic process applicable to each protein.

U.S. Pat. No. 6,406,903 issued to Bray et al., teaches a protein crystallization system employing temperature-based precipitation of proteins from solution, and uses humidity or temperature detectors to dynamically control the conditions within the system. A vapour diffusion system is described in which a protein-containing solution is exposed to a precipitant solution, causing water vapor to diffuse away from the protein solution. Also, a temperature-based system is described in which the temperature of a protein-containing solution is raised or lowered to initiate or promote crystal growth. It may employ a water-cooled heatsink. Although temperature fluctuations are used, this patent does not disclose the maintenance of a temperature differential.

U.S. Pat. No. 4,886,646 issued to Carter et al., relates to the aforementioned "hanging drop" method of crystal growth in which a drop of an aqueous protein-containing solution is allowed to hang over a well and evaporate to form a crystal. A flow of control fluid near the hanging drop is used to create a vapour pressure gradient and to withdraw water from the drop. However, it does not use a temperature modification method to create a temperature gradient. The hanging drop method and the effect of temperature changes on condensation, nucleation and crystal growth are discussed in a technical paper by Hampton Research Corporation (2001).

U.S. Pat. No. 4,755,363 issued to Fujita et al., describes a system for forming protein crystals using a variety of solvents. It can be adapted to different methods of forming a crystal, including a batch-wise method, a vapour diffusion method, and a free interface diffusion method, each of which employs concentrated solvents to draw water vapour out of a protein-containing solution. The system described includes a temperature control unit, and the role of changing temperature gradually within a closed system is discussed as a way of controlling crystal growth.

U.S. Pat. No. 6,409,832 issued to Weigl et al., discloses a device for promoting protein crystallization from solution. It employs a solvent-based laminar flow methodology, in which a protein is crystallized by exposure to a solvent within a microfluidic channel, effecting de-watering of the protein.

U.S. Pat. No. 5,643,540 issued to Carter et al., discloses a closed system for forming protein crystals in microgravity. The system uses concentrated solvents to form a vapour pressure differential with a protein-containing solution, but not a temperature differential. Further, the level of vaporation is not controlled.

It is, therefore, desirable to provide a temperature- and vapor-controlled protein crystallization device that can be used under conditions of microgravity.

SUMMARY OF THE INVENTION

It is an object of the present invention to obviate or mitigate at least one disadvantage of previous protein crystallization devices.

The present invention provides a protein temperature evaporation controlled crystallization device (herein referred to as the PROTECC™ crystallization device).

One embodiment of the invention provides a device for protein crystallization comprising a compartment for the placement of a protein-containing solution and a cold generating unit spaced apart from and in closed fluid communication with the compartment. The cold generating unit maintains a temperature lower than the temperature of the compartment.

Another embodiment of the invention provides a method for forming protein crystals. A protein-containing solution is placed in a compartment adapted for this purpose. A region of reduced temperature is spaced apart from (and in closed fluid communication with) the compartment, thus drawing water vapour out of the protein-containing solution by allowing vapour to flow out of the compartment toward the region of reduced temperature. This process continues until protein crystals form in the compartment.

A further embodiment of the invention provides a device for protein crystallization. The device comprises an open vessel for placement of a protein-containing solution; a vacuum tube for placement of the open vessel therein; a vacuum pump and vacuum gage for creating and monitoring vacuum pressure within the vacuum tube; sealing means forming a seal between the open vessel and the vacuum pump; and a cold generating unit spaced apart from and in closed fluid communication with the open vessel, the cold generating unit maintaining a temperature lower than the temperature of the open vessel.

It is an advantage of this embodiment of the invention that water is removed, reducing humidity and allowing water to retreat to the coldest part of the system, remote from the crystallization milieu. Advantageously, a humidity detector is not needed as the temperature-controlled cold finger defines the humidity and is, in effect, its own detector.

In a further embodiment, microcapillary tubes are provided to hold the protein-containing solution. This embodiment is advantageous in that there is no need to rely solely on saturation and solubility parameters. Further, the newly-formed crystals do not need to be removed from their containers for analysis, thus reducing handling and possible contamination.

A vacuum pump can be used to reduce the vapor pressure, promote crystallization, or increase crystallization rate.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures.

DETAILED DESCRIPTION

In general, the present invention provides a device for protein crystallization comprising a compartment for the placement of a protein-containing solution and a cold generating unit spaced apart from (and in closed fluid communication with) the compartment. The cold generating unit maintain a temperature lower than the temperature of the compartment.

In another aspect, the present invention provides a method for forming protein crystals. A protein-containing solution is contained in a compartment adapted for this purpose. A region of reduced temperature is spaced apart from (and in closed fluid communication with) the compartment, thus drawing water vapour out of the protein-containing solution by allowing vapour to flow out of the compartment toward the region of reduced temperature. This process continues until protein crystals form in the compartment.

The protein crystals formed according to the invention can be prepared for subsequent analysis of 3-dimensional structure using technologies such as X-ray crystallography or cyclotron imaging.

Embodiments of the invention provide a cold-generating unit (such as a cold finger) spaced apart from an open vessel (such as a microcapillary tube or a well-type container) in which the protein-containing solution is placed. The cold finger and the open vessel are in closed fluid communication with each other. The cold finger maintains a temperature lower than the temperature of the vessel, but does not equilibrate with the temperature of the vessel. This creates a temperature differential, and accordingly, a vapor pressure differential is maintained. The vapor pressure differential causes a flow of water vapor out of the protein-containing solution (de-watering; see below). In one embodiment, a vacuum may be applied to expedite evaporation and allow controlled movement of water vapor out of the protein-containing solution (toward the area of lower vapor pressure). Where it is desirable to apply a vacuum, the open vessel is of suitable dimensions to be housed within a vacuum tube.

Figure 1:
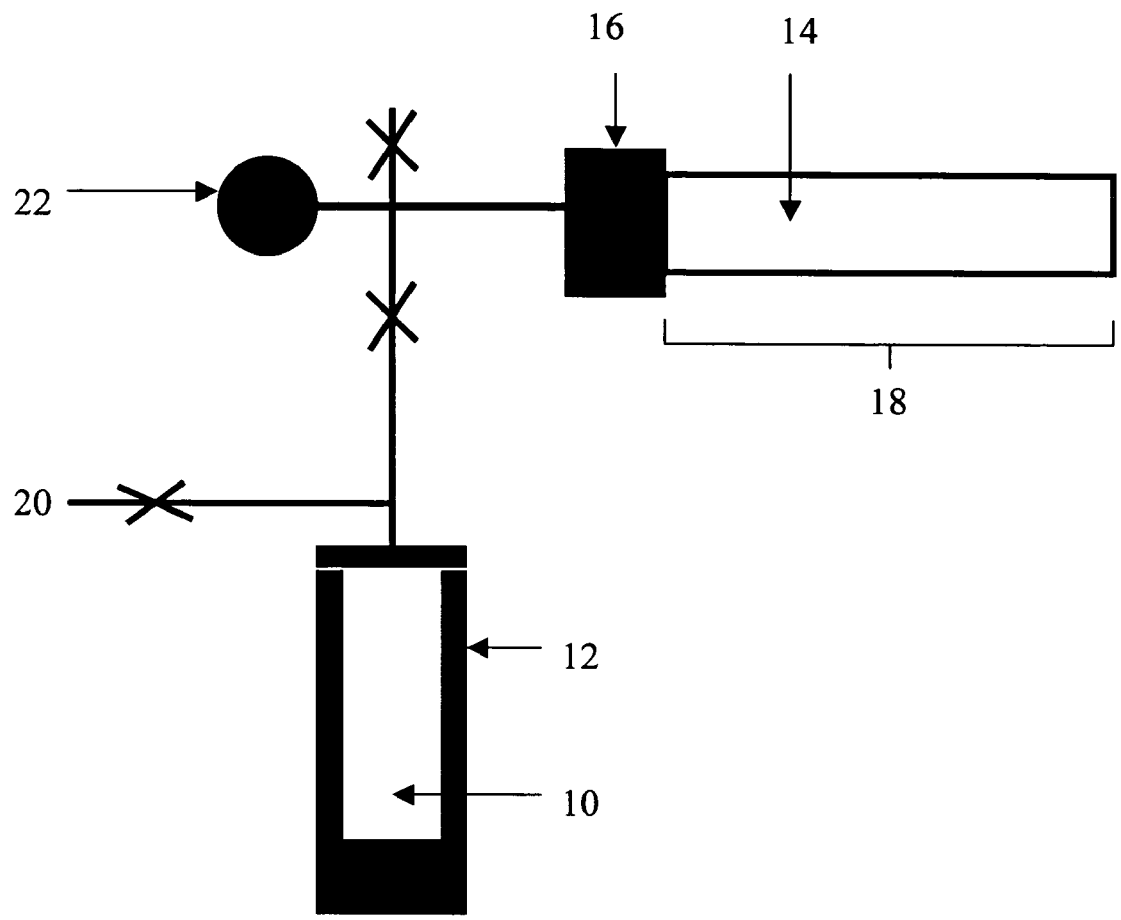
FIG. 1 is a schematic representation of the PROTECC™ crystallization device according to an embodiment of the invention.

FIG. 1 shows a schematic view of the PROTECC™ crystallization device. The device comprises a cold-generating unit [12] such as a dewar flask which contains a cold finger [10]. Attached to the cold-generating unit [10] is a compartment, in this case an open vessel [14], which is contained within an outer vacuum tube [18]. Crystalization takes place within the open vessel [14]. In one embodiment, the open vessel is a micropipette (microcapillary tube), but can also be a microarray, microtiter plate, or any container in which the protein, once crystallized, can be analyzed without further transfer. The outer vacuum tube [18] surrounds the open vessel. A vacuum pump [20] is located between the cold-generating unit [10] and the open vessel [14]. A vacuum gauge [22] monitors vacuum pressure in the outer vacuum tube [18]. The vacuum gauge is attached to the vacuum cap which has sealing means, such as in this case O-ring control valves [16], and is located between the vacuum pump [20] and the open vessel [14].

Figure 2:
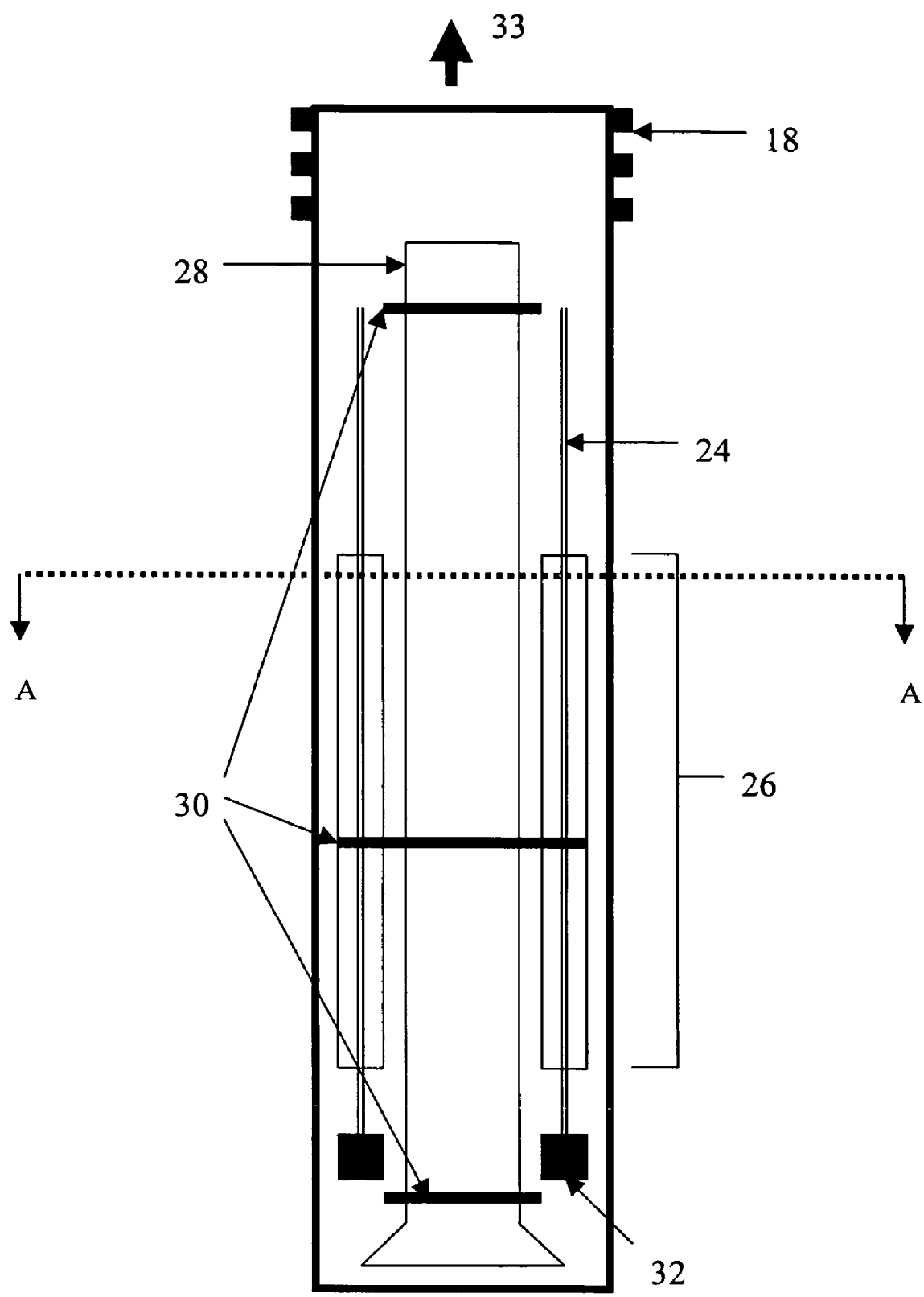
FIG. 2 is a plan view of the crystallization chamber and vacuum tube unit of the PROTECC™ crystallization device of FIG. 1.

FIG. 2 illustrates crystallization chamber and vacuum tube unit of the PROTECC™ crystallization device. The threaded outer vacuum tube [18] surrounds a micropipette assembly comprising micropipettes [24], micropipette holder tubes [26] and an inner support tube [28] which flares at the base and is longer than the holder tubes [26], thus forming a sealable vacuum chamber. Rubber micropipette locks [30] slide onto the inner support tube [28] holding the micropipettes [24] in place and limiting micropipette movement. The end of each micropipette tube [24] is capped with a critocap [32], sealing it at the closed end of the outer vacuum tube [18]. This arrangement encourages dewatering movement in the direction of the cold finger [33].

Figure 3:
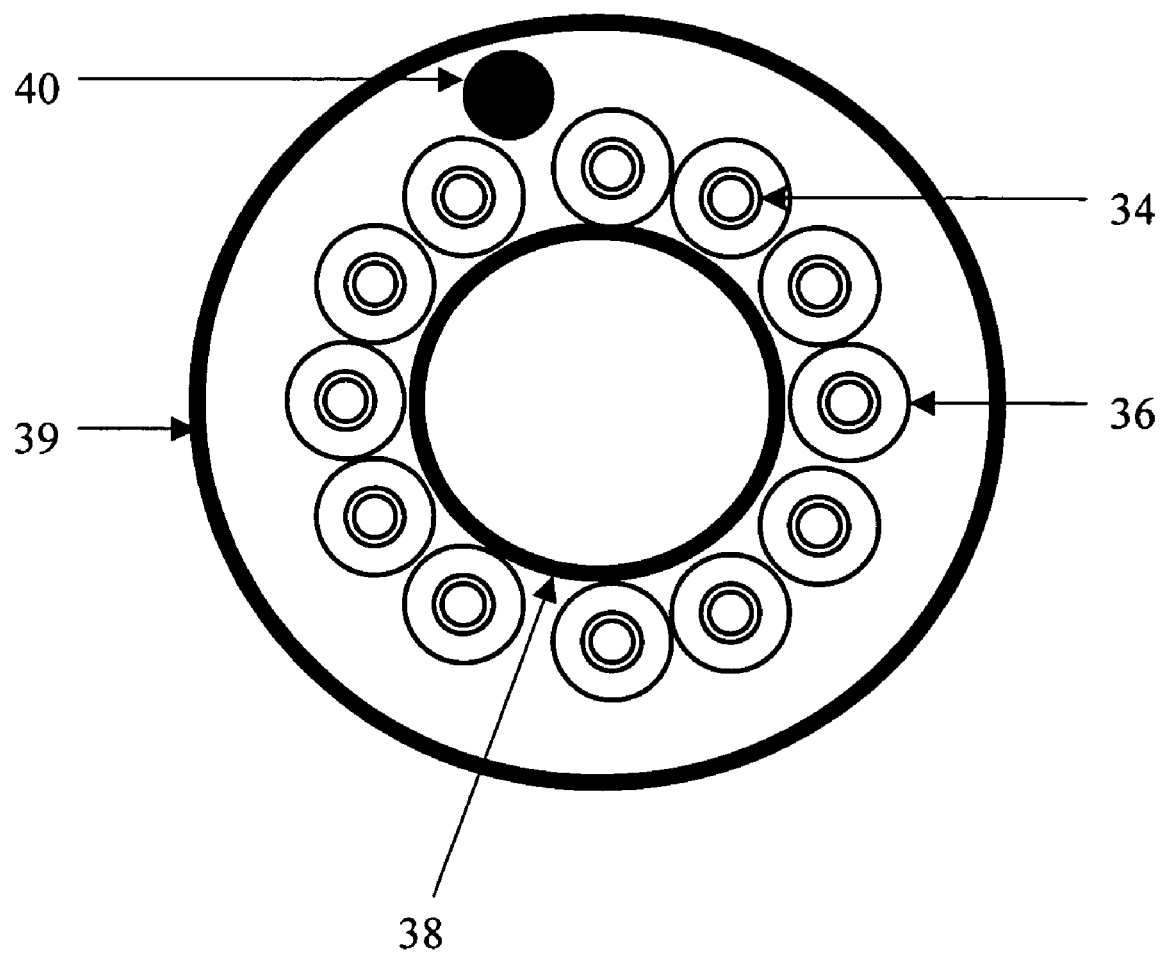
FIG. 3 is a cross section of the crystallization chamber of FIG. 2.

FIG. 3 is a cross section of the crystallization chamber (identified as A—A on FIG. 2). Micropipettes [34] slide into holder tubes [36], which are positioned, on the outside circumference of an inner support tube [38]. The inner support tube [38] with the holder tubes [36] must slide snugly into the outer vacuum tube [39]. The inner support tube [38] is longer than both the holder tubes [36] and the micropipettes [34] such that the insert unit movement within the outer tube [39] is limited. Accordingly, after insertion the micropipette holder tubes [36] are as close as possible to the outer vacuum tube [39] without presenting binding problems. A locking rod [40] is preferably used. Open ends of the micropipettes [34] are not obstructed so that de-watering is not compromised.

The full length of each micropipette under a microscope through the outer tube wall is examined. For observation, the complete insert unit rotates with the outer tube. The design ensures that movement of all components is limited to prevent damage during transport.

In one embodiment, twelve Fisher™ micropipettes (100 µL 125 mm total length×1.7 mm OD) are used, although any open vessel (e.g., a microtiter plate) of any length can be used. Twelve micropipettes of this length would thus slide into 2 mm ID×100 mm long holder tubes.

The method for forming protein crystals according to the invention comprises the steps of providing a protein-containing solution in an open vessel; creating a region of reduced temperature (such as by using a cold finger) spaced apart from and in closed fluid communication with the open vessel; and drawing water vapor out of the protein-containing solution (de-watering) by allowing vapor flow out of the open vessel toward the region of reduced temperature until a protein crystal is formed in the open vessel. The optional step of applying a vacuum may be employed. The temperature differential between the vessel and the region of reduced temperature may be up to about 25° C.

More generally, the reduced temperature is an adjustable temperature in the range of 20° C. to −15° C. Preferably, the reduced temperature is below approximately 0° C. As an example, the device may be exposed to a pressure of about 26 inches of Hg. However, other levels of evacuation may be employed, as would be clearly understood by one skilled in the art. The step of drawing water vapor out of the protein-containing solution may additionally comprise application of a vacuum to the compartment. Optionally, the method is performed in a microgravity environment, but this is not required for function of the method.

De-Watering Control

The de-watering rate is related to the sample temperature and the cold finger temperature. Using Fisher™ micropipettes (1.1 mm OD) filled to the opening with water, de-watering rates increase with decreasing cold finger temperature (Table 1). The cold finger temperature could be programmed to provide variable (increased, reversed, or stopped) de-watering rates throughout the process to optimize crystal perfection and size. For example, it may be beneficial to start with a relatively high de-watering rate to initiate nucleation then gradually decrease the rate during the bulk crystal growth stage.

TABLE 1

De-watering rate as a function of temperature

| Cold finger temperature (° C.) | 20 | 5 | 0 |
|---|---|---|---|
| Average loss per 100 hours (μL) | 0 | 7 | 8 |

Figure 4:
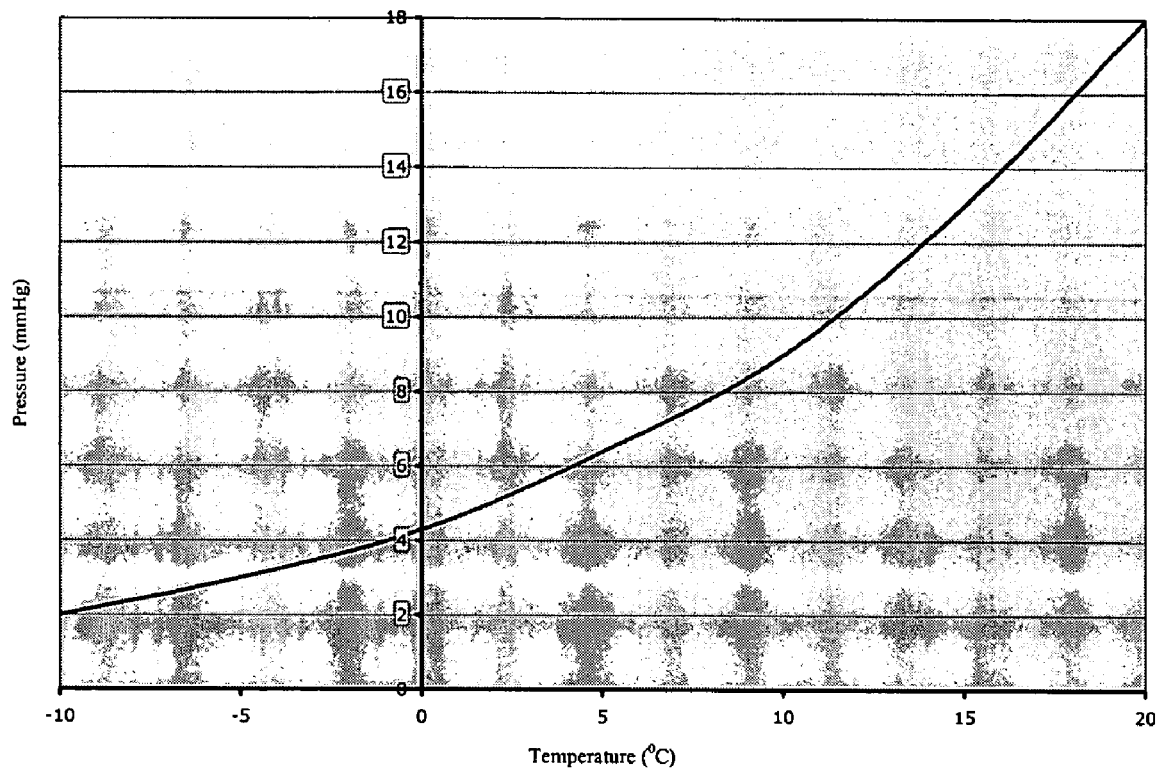
FIG. 4 is a graph illustrating the vapor pressure of water vs. temperature, for temperatures between −15° C. and 20° C.

FIG. 4 illustrates the effectiveness of change to the cold finger temperature related to the water equilibrium partial pressure vs. temperature relationship. This indicates, for example, that a change from +10° C. to 0° C. is approximately 2.2 times as effective as a 10 degree temperature reduction from 0° C. to −10° C.

As the dead space between the water level and the capillary opening increases, a water loss rate reduction was noted. If a full-length 100 μL Fisher™ micropipette is used uncut there would be about 107 mm of dead space. This may slow down the de-watering to unacceptable levels so the capillary should be cut shorter with a cutting stone. The PROTECC™ crystallization device was designed to accept capillaries of varying lengths. Any unfilled portions (eg., air bubbles) of the capillary tubes should not be located between the solution and the critocap as this air bubble would expand when the vacuum is applied and liquid could be withdrawn from the capillary.

The de-watering rate from protein solution will probably be slower than when water alone is used. If the de-watering rate slows to unacceptable levels when the proteins are present, some help could be obtained by using a colder finger. This improvement in rate would be small as the vapour pressure change with temperature decreases.

To provide a de-watering rate control, soluble air from the protein containing solution should be removed and, if a vacuum is used, the system should never reach the boiling point of water at the protein solution temperature. For example, a solution at 20° C. should not be exposed to a pressure which goes below 18 torr.

De-watering control may be achieved by varying the temperature of the cold generating unit, and thus the humidity of the compartment in which the protein-containing solution is placed. Using programmable, automated means, de-watering can be stopped, increased and even reversed if desired. Gross and fine control can be used. By allowing automated control, different dewatering rates can be utilized during nucleation and growth stages of crystal formation to yield higher reproducibility and thus achieve a higher perfection of crystals.

De-watering rate control can be improved if soluble air is removed from the protein-containing solution so as to ensure that a vacuum imposed on the device does not reach the boiling point of water at the protein solution temperature. For example at 20° C., pressures of above 18 torr can be maintained.

Precipitants and stabilizers may optionally be used within the protein-containing solution to promote crystal formation. For example, precipitant solutions may be PEG, such as PEG 3350 or PEG 6000 used at concentrations ranging up to 40% (w/v) may be used, preferably PEG 3350 at 25%, or PEG 6000 at 30%. NaCl solutions at concentrations of up to 20% (w/v), and preferably at 16% may be used. Ammonium sulfate solutions at concentrations of up to 70% (w/v), and preferably at 60% may be used.

Figure 5:
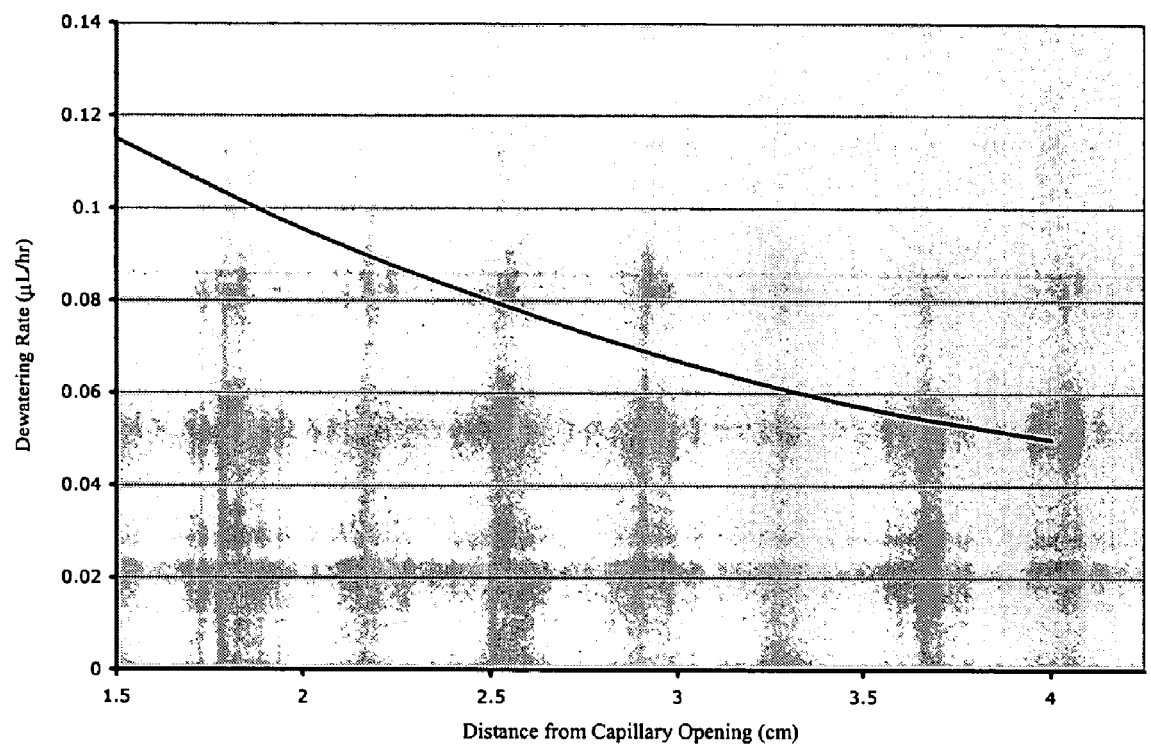
FIG. 5 is a graph illustrating distance from the capillary opening vs. the de-watering rate of protein-containing solution using a −5° C. cold-finger and 100 μL micropipette.

FIG. 5 illustrates the effect of increasing the dead air space between the opening of the microcapillary tube and the meniscus on the de-watering rates in Fisher™ 100 μL micropipettes using a −5° C. coldfinger. Distances from the microcapillary tube opening and the meniscus ranges from 1.5 to 4.0 cm. The de-watering rate is greater when the distance from the opening is the smallest, but still proceeds at a rapid rate when the distance is larger.

Figure 6:
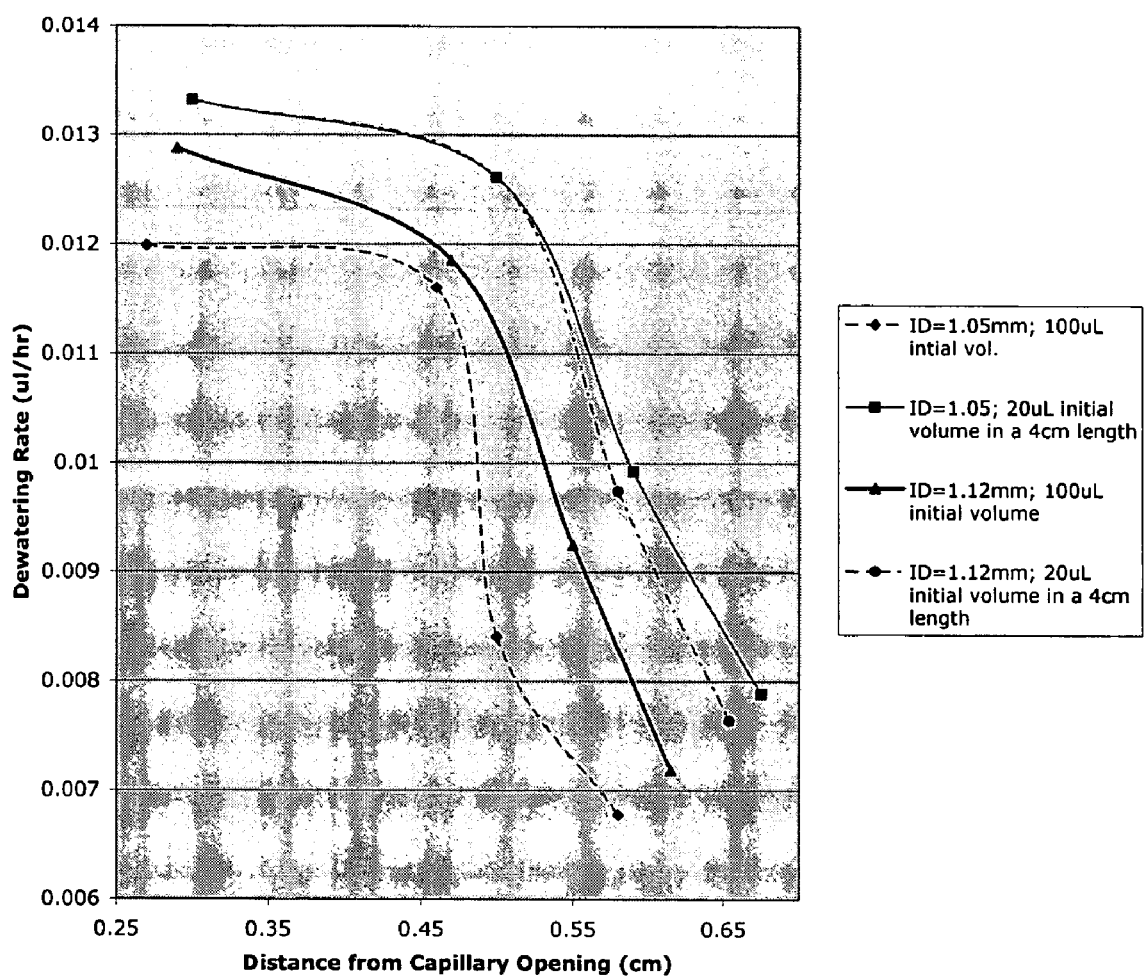
FIG. 6 is a graph illustrating the dewatering rates of capillary tubes with differing inside diameters and volumes.

FIG. 6 illustrates the effect of increasing the inside diameter of the capillary tubes on dewatering rates, specifically, capillary tubes with inside diameters of 1.12 mm and 1.05 mm. Initial volumes of 100 and 20 μL are observed. The de-watering rate is most rapid in the tubes having a larger inside diameter (1.12 mm), but still proceeds at a high rate for those tubes having a smaller inside diameter (1.05 mm).

In one embodiment, the PROTECC™ crystallization device and method are used for the formation of a protein crystal in a microgravity environment. Although not essential to the instant invention, the microgravity environment may be used to improve the quality of the protein crystal formed. For terrestrial applications, hanging or sitting drops could replace capillary tubes. In this case, the de-watering rate would not decrease as the dead space increases. The loss of volume would be controllable by programming the temperature of the cold finger.

EXAMPLE

Twelve micropipettes were filled with 40 μL protein solution. For this volume, the micropipette was cut to about 40 mm total length using a cutting stone. One end of the micropipette was sealed off with a critocap. The micropipettes were installed into holder tubes and this assembly was inserted into an outer vacuum tube. The end cap was installed with valves and a gauge. The vacuum tube, cold finger and vacuum pump were set up as shown in FIG. 1. The assembly was evacuated to about 26 inches of mercury. The cold finger was cooled to 0° C. (or lower). Crystals were collected after removal of the outer vacuum and removal from the cold finger for microscopic observation and microphotography.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A device for protein crystallization comprising:
   an open vessel for placement of a protein-containing solution;
   a vacuum tube for placement of the open vessel therein;
   a vacuum pump and vacuum gage for creating and monitoring vacuum pressure within the vacuum tube;
   sealing means forming a seal between the open vessel and the vacuum pump; and
   a cold generating unit spaced apart from and in closed fluid communication with the open vessel, the cold generating unit maintaining a temperature lower than the temperature of the open vessel.

2. The device of claim 1, wherein the cold generating unit is a cold finger.

3. The device of claim 1, wherein the cold generating unit is contained within a dewar flask.

4. The device of claim 1, wherein the open vessel is a microcapillary tube or microtiter plate.

5. The device of claim 1, wherein the vacuum tube is adapted to hold a plurality of micropipette microcapillary tubes therein, each tube having a volume of approximately 100 μL.

6. A method for forming protein crystals comprising the steps of:
   a) providing a protein-containing solution in a compartment adapted for the placement of a protein-containing solution;
   b) creating a region of reduced temperature spaced apart from and in closed fluid communication with the compartment; and
   c) drawing water vapor out of the protein-containing solution by allowing vapor flow out of the compartment toward the region of reduced temperature until a protein crystal is formed in the compartment.

7. The method of claim 6, wherein the region of reduced temperature is created using a cold generating unit spaced apart from and in closed fluid communication with the compartment, the cold generating unit maintaining a temperature lower than the temperature of the compartment.

8. The method of claim 6, wherein the reduced temperature is an adjustable temperature in the range of from about 20° C. to about −15° C.

9. The method of claim 8, wherein the reduced temperature is below about 0° C.

10. The method of claim 6, wherein the step of drawing water vapor out of the protein-containing solution additionally comprises application of a vacuum to the compartment.

11. The method of claim 6, wherein the step of drawing water vapor out of the protein-containing solution is conducted at a pressure of about 26 inches of Hg.

12. The method of claim 6, wherein the method is performed in a microgravity environment.

* * * * *